(12) United States Patent
Gilbertson et al.

(10) Patent No.: US 11,144,535 B2
(45) Date of Patent: Oct. 12, 2021

(54) ON-BOARD VEHICLE RECORDER SYSTEM MONITOR

(71) Applicant: The Boeing Company, Chicago, IL (US)

(72) Inventors: Daniel David Gilbertson, Florissant, MO (US); Christopher M. Mutschler, Renton, WA (US)

(73) Assignee: The Boeing Company, Chicago, IL (US)

(*) Notice: Subject to any disclaimer, the term of this patent is extended or adjusted under 35 U.S.C. 154(b) by 278 days.

(21) Appl. No.: 16/206,397

(22) Filed: Nov. 30, 2018

(65) Prior Publication Data

US 2020/0174992 A1    Jun. 4, 2020

(51) Int. Cl.
    *G06F 16/23*    (2019.01)
    *G06F 16/215*    (2019.01)

(52) U.S. Cl.
    CPC ........ *G06F 16/2365* (2019.01); *G06F 16/215* (2019.01)

(58) Field of Classification Search
    CPC ... G06F 16/2365; G06F 16/215; B64D 45/00; H04B 7/00
    USPC ......................................................... 707/691
    See application file for complete search history.

(56) References Cited

U.S. PATENT DOCUMENTS

| | | | | |
|---|---|---|---|---|
| 6,044,069 A * | 3/2000 | Wan | ................ | H04W 52/0216 370/311 |
| 6,522,635 B1 * | 2/2003 | Bedwell | ............ | H04B 7/18528 370/314 |
| 10,755,284 B2 * | 8/2020 | Simpson | ............... | G06Q 30/018 |
| 2003/0036399 A1 * | 2/2003 | Casaccia | ............... | H04L 1/1685 455/515 |
| 2009/0278941 A1 * | 11/2009 | Smith | ................ | H04N 21/4223 348/207.1 |
| 2013/0274964 A1 * | 10/2013 | Jesse | ................... | G05D 1/0077 701/14 |

(Continued)

FOREIGN PATENT DOCUMENTS

| EP | 3133781 A1 * | 2/2017 | ............ H04L 43/16 |
|---|---|---|---|
| EP | 3133781 A1 | 2/2017 | |

OTHER PUBLICATIONS

EP, Search Report, EP Patent Application 19211955.0-1202/3660615 (dated Oct. 6, 2020).

*Primary Examiner* — Giovanna B Colan
(74) *Attorney, Agent, or Firm* — Vivacqua Crane

(57) ABSTRACT

An on-board recording system for a vehicle is disclosed. The on-board recording system is configured to monitor data for errors. The on-board recording system includes one or more processors and a memory coupled to the one or more processors. The memory stores data comprising a database and program code that, when executed by the processors, causes the on-board recording system to receive as input a data sequence including a plurality of frames. The frames are received and recorded by the on-board recorder at a corresponding assigned time offset and include a corresponding assigned message. The on-board recording system is further caused to determine a missing assigned message that has not been received at the corresponding assigned time offset. In response to determining the missing assigned message, the on-board recording system calculates a total length of time based on a number of missing assigned messages stored in the memory.

20 Claims, 2 Drawing Sheets

FRAME

(56) References Cited

U.S. PATENT DOCUMENTS

| | | | | |
|---|---|---|---|---|
| 2014/0079040 A1* | 3/2014 | Smith | ................ | H04B 7/18539 370/337 |
| 2014/0180556 A1* | 6/2014 | Warkentin | .............. | G06F 17/00 701/99 |
| 2014/0330506 A1* | 11/2014 | Ng | ....................... | G07C 5/0816 701/123 |
| 2015/0103885 A1* | 4/2015 | Feng | ................... | H04L 43/0841 375/240.02 |

* cited by examiner

ON-BOARD VEHICLE RECORDER SYSTEM MONITOR

INTRODUCTION

The present disclosure relates to a vehicle having one or more on-board recorders. More particularly, the present disclosure relates to a system for monitoring and detecting errors in data collected by on-board recorders for a vehicle.

BACKGROUND

Many vehicles monitor, record, and store information pertaining to various operating parameters. For example, an aircraft includes on-board recorders that monitor and record various operating parameters of the aircraft before, during, and after flight. Some examples of operating parameters include, but are not limited to, sensor readings, operator inputs, and waypoints. The data stored on the on-board recorders of the aircraft are then transferred to one or more ground processing computers for further analysis.

Sometimes the on-board recorder may experience a fault. As a result of the fault, the data recorded may be of poor quality. Another cause of poor quality data is when a set of parameters being recorded is modified. Poor quality data is usually not detected as the on-board recorder monitors and records data during a flight. As a result, sometimes the on-board recorder may continue to record poor quality data throughout the entire flight, and in some instances the recording may continue to occur during subsequent flights as well. Sometimes poor quality data is not detected at all. As a result, the on-board recorder continues to record poor quality data for long periods of time. In fact, the poor quality data may be subsequently analyzed by the ground processing computers. Analyzing the poor quality data may affect the accuracy of the analytics.

SUMMARY

According to several aspects, an on-board recording system for a vehicle is disclosed. The on-board recording system is configured to monitor data for errors and includes one or more processors and a memory coupled to the one or more processors. The memory stores data comprising a database and program code that, when executed by the one or more processors, causes the on-board recording system to receive as input a data sequence including a plurality of frames that are each received and recorded by the on-board recording system at a corresponding assigned time offset and include a corresponding assigned message. The on-board recording system is further caused to determine a missing assigned message that has not been received at the corresponding assigned time offset. In response to determining the missing assigned message, the on-board recording system calculates a total length of time based on a number of missing assigned messages that are stored in the memory. The on-board recording system is caused to compare the total length of time with a threshold length of time. The on-board recorder determines the total length of time is greater than the threshold length of time. In response to determining the total length of time is greater than the threshold length of time, the on-board data recording system determines an error has occurred.

In an embodiment of the disclosure, the processors execute instructions to determine the total length of time is less than or equal to the threshold length of time. In response to determining the total length of time is less than or equal to than the threshold length of time, the on-board recording system determines a percentage of missing assigned messages with respect to an entire run time of the data sequence saved in the memory of the on-board recording system.

In another embodiment of the disclosure, the processors execute instructions to compare the percentage of missing assigned messages with a threshold percentage value and determine that the percentage of missing assigned messages is greater than the threshold percentage value. In response to determining that the percentage of missing assigned messages is greater than the threshold percentage value, the on-board recording system determines the error has occurred.

In still another embodiment of the disclosure, the processors execute instructions to receive a first frame having a first assigned message with a first timestamp, where the first frame is part of the data sequence. The on-board recording system receives a second frame having a second assigned message with a second timestamp, where the second frame is received after the first frame. The on-board recording system compares the first timestamp of the first assigned message to the second timestamp of the second assigned message and determines the first timestamp is identical to the second timestamp.

In yet another embodiment of the disclosure, in response to determining the first timestamp is identical to the second timestamp, the on-board recording system compares a first data content of the first assigned message with a second data content of the second assigned message. The on-board recording system determines the first data content is not identical to the second data content. In response to determining the first data content is not identical to the second data content, the on-board recording system determines the error has occurred.

In an embodiment of the disclosure, the processors execute instructions to receive one or more frames that each include the corresponding assigned message after receiving the second frame. The on-board recording system determines that one or more corresponding assigned messages include timestamps identical to the first timestamp and assigned messages that are different from the first assigned message.

In another embodiment of the disclosure, in response to determining the one or more corresponding assigned messages include the timestamps that are identical to the first timestamp and assigned messages that are different from the first assigned message, the on-board recording system determines a number of assigned messages of the data sequence stored in the memory of the on-board recording system that include the timestamps that are identical to the first timestamp and assigned messages and that are different from the first assigned message. The on-board recording system compares the number of assigned messages to a threshold number of repeated timestamps. The on-board recording system determines the number of assigned messages is greater than the threshold number of repeated timestamps. In response to determining the number of assigned messages is greater than the threshold number of frames, the on-board recording system determines the error has occurred.

In still another embodiment of the disclosure, the processors execute instructions to detect a single frame having an incorrect bit length, where the single frame is part of the data sequence including the plurality of frames.

In yet another embodiment of the disclosure, in response to detecting the single frame having the incorrect bit length, the on-board recording system determines the error has occurred.

In an embodiment of the disclosure, after detecting the single frame having the incorrect bit length, the on-board recording system continues to monitor the data sequence. The on-board recording system detects one or more frames that are part of the data sequence and are stored in the memory of the on-board recording system that each have the incorrect bit length. The on-board recording system determines the one or more frames having the incorrect bit length exceed a threshold number of frames having incorrect bits. In response to determining the one or more frames having the incorrect bits exceed the threshold number of frames having incorrect bits, the on-board recording system determines the error has occurred.

In another embodiment of the disclosure, in response to determining the error, the on-board recording system generates an alarm.

In still another embodiment of the disclosure, the plurality of frames each include one or more message identifiers associated with the corresponding assigned message. The processors execute instructions to compare the one or more message identifier of each of the plurality of frames with an expected set of message identifiers. The on-board recording system determines at least one message identifier of one of the plurality of frames is not included in the expected set of message identifiers. In response to determining at least one message identifier is not included in the expected set of message identifiers, the on-board recording system determines the error has occurred.

In yet another embodiment of the disclosure, the plurality of frames each include one or more message identifiers associated with the corresponding assigned message. A unique message identifier is assigned to a unique time offset.

In an embodiment of the disclosure, the processors execute instructions to compare a timestamp for the unique message identifier for each of the plurality of frames with the assigned unique time offset. The on-board recording system determines the timestamp of the unique message identifier indicates the corresponding assigned message was sent at a time that is different from the unique time offset. In response to determining the corresponding assigned message was sent at a time that is different from the unique time offset, the on-board recording system determines the error has occurred.

In another embodiment of the disclosure, the vehicle is an aircraft, an automobile, an unmanned aerial vehicle (UAV), a spacecraft, or a marine vessel.

In another embodiment of the disclosure, a method for detecting errors in an on-board recording system in a vehicle is disclosed. The method includes receiving, by a computer of the on-board recording system, a data sequence including a plurality of frames that are received and recorded by the on-board recording system at a corresponding assigned time offset and include a corresponding assigned message. The method includes determining, by the computer, a missing assigned message that has not been received at the corresponding assigned time offset. In response to determining the missing assigned message, the method calculates a total length of time based on a number of missing assigned messages stored in a memory. The method also includes comparing the total length of time with a threshold length of time and determining the total length of time is greater than the threshold length of time. In response to determining the total length of time is greater than the threshold length of time, the method includes determining an error has occurred.

In an embodiment of the disclosure, the method further includes determining the total length of time is less than or equal to the threshold length of time. In response to determining the total length of time is less than or equal to than the threshold length of time, the method includes determining a percentage of missing assigned messages with respect to an entire run time of the data sequence saved in the memory of the on-board recording system.

In another embodiment of the disclosure, the method further includes comparing the percentage of missing assigned messages with a threshold percentage value. The method also includes determining the percentage of missing assigned messages is greater than the threshold percentage value. In response to determining that the percentage of missing assigned messages is greater than the threshold percentage value, the method includes determining the error has occurred.

In still another embodiment of the disclosure, the method includes receiving a first frame having a first assigned message with a first timestamp, where the first frame is part of the data sequence. The method also includes receiving a second frame having a second assigned message with a second timestamp, where the second frame is received after the first frame. The method also includes comparing the first timestamp of the first assigned message to the second timestamp of the second assigned message. The method also includes determining the first timestamp is identical to the second timestamp.

In yet another embodiment of the disclosure, in response to determining the first timestamp is identical to the second timestamp, the method includes comparing a first data content of the first assigned message with a second data content of the second assigned message. The method further includes determining the first data content is not identical to the second data content. In response to determining the first data content is not identical to the second data content, the method includes determining the error has occurred.

In an embodiment of the disclosure, the method further includes detecting a single frame having an incorrect bit length, where the single frame is part of the data sequence including the plurality of frames. In response to detecting the single frame having the incorrect bit length, the method includes determining the error has occurred.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

The disclosed systems and methods provide an approach for detecting an error while recording data in a vehicle. Specifically, an on-board recorder is used to store data from a specific system, sub-system, or component of the vehicle.

The data includes information relating to a plurality of operating parameters of the vehicle and is in the form of data sequences. An on-board recording system monitors the data sequences for a variety of characteristics that indicate an error, which are explained in greater detail below. In response to determining an error, the on-board recording system generates one or more alarms or other indicators that notify personnel that a fault that has occurred with the on-board recorder.

The following description is merely exemplary in nature and is not intended to limit the present disclosure, application, or uses.

Figure 1:
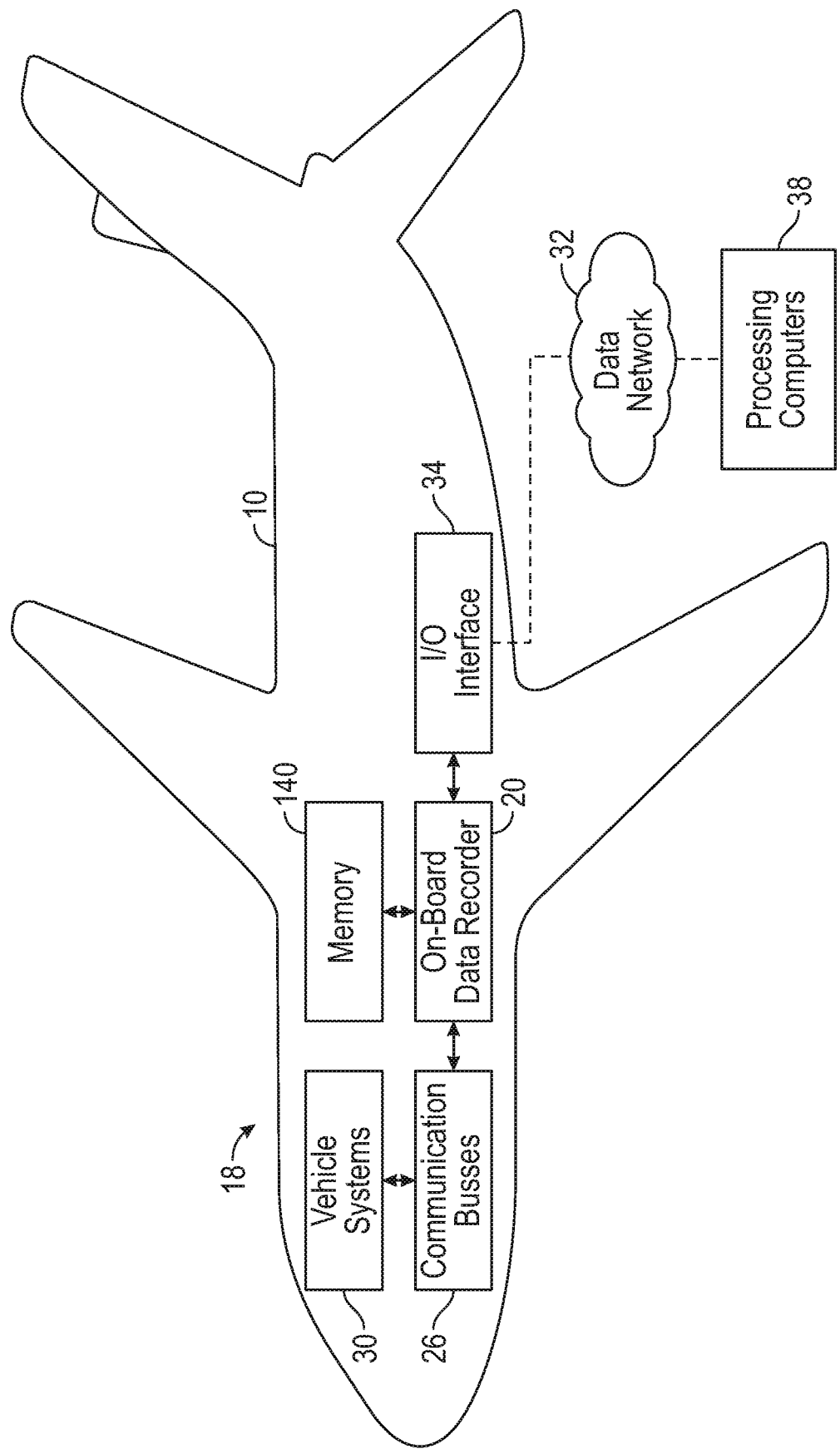
FIG. 1 is a schematic diagram of a vehicle including an on-board recording system, according to an exemplary embodiment.

Referring to FIG. 1, an exemplary vehicle 10 having an on-board recorder 20 is shown. The on-board recorder 20 is part of an on-board recording system 18. The on-board recording system 18 is configured to monitor data for errors, and includes the on-board recorder 20, one or more communication busses 26, and one or more vehicle systems 30. In an embodiment, the on-board recording system 18 further includes a data network and one or more processing computers 38 as well. The vehicle 10 is illustrated as an aircraft, however it is to be appreciated that the disclosure is not limited to an aircraft. Instead, the vehicle 10 may be any device for transporting people or goods. For example, in another embodiment the vehicle 10 may be an automobile such as a car, truck, sport utility vehicle, or a van. Some other examples of the vehicle 10 include, but are not limited to, an unmanned aerial vehicle WAY), a spacecraft, a semi-trailer truck, a train, or a marine vessel. Furthermore, although only a single on-board recorder 20 is shown, it is to be appreciated that in some embodiments the vehicle 10 includes a plurality of on-board recorders 20. For example, an aircraft includes a plurality of on-board recorders 20, where one or more on-board recorders 20 monitor and record data generated by a particular system, sub-system, or component of the aircraft. However, only one on-board recorder 20 is illustrated in FIG. 1 for purposes of clarity.

The on-board recorder 20 is in electronic communication with and is configured to monitor and record data received from one or more communication buses 26. The communication buses 26 are in electronic communication with one or more vehicle systems, sub-systems, or components. The vehicle systems, sub-systems, and components are illustrated in FIG. 1 as the vehicle systems 30. The communication buses 26 are configured to transmit data from the vehicle systems 30 to the on-board recorder 20. Some examples of vehicle systems 30 include, but are not limited to, a flight control system, a navigation system, a landing gear system, an environmental control system (ECS), an anti-ice system, a fuel system, a pneumatic system, a display system, and a hydraulic system. The vehicle systems 30 include various sensors and devices that monitor one or more operating parameters of the vehicle 10. Some examples of operating parameters in an aircraft include, but are not limited to, velocity, engine speed (in RPM), and landing gear position. In another example, the operating parameter is an operator input, such as pilot input for operating the flight control system. In still another embodiment, the operating parameter is a fault indicator or an operating mode (e.g., air conditioning on/off mode).

In one embodiment, the on-board recorder 20 is in electronic communication with one or more processing computers 38 by the data network 32 and an I/O interface 34. The processing computers 38 are remotely located from the vehicle 10 and analyze the data recorded by the on-board recorder 20. For example, in one embodiment, the processing computer 38 may be ground processing computers. In an alternative embodiment, the processing computer 38 are part of a cloud computing system. The data monitored by the on-board recorder 20 is transmitted to the processing computers 38 using a variety of different approaches. For example, in one embodiment the on-board recorder 20 is configured to record and store data in a memory 140 in the form of one or more data files. The data files are then sent over the data network 32 to the processing computers 38. If the vehicle 10 is an aircraft, then the processing computers 38 perform post-flight analysis of the data recorded by the on-board recorder 20. In an alternative embodiment, the data monitored by the on-board recorder 20 is streamed over the data network 32 to the processing computers 38 in real-time. In yet another embodiment, the on-board recorder 20 is configured to record and store data in the memory 140 in the form of one or more data files, and the memory 140 is part of a removable storage device. Some examples of removable storage devices include, but are not limited to, data recording cartridges and external hard drives. The removeable storage device may then be removed from the vehicle 10 and is physically transported to the processing computers 38.

The on-board recorder 20 receives data from the communication buses 26. The data is in any form that is compatible with or is configured to send over a communication bus. Some examples of data include, but are not limited to, bits, integers, floating point arithmetic per the Institute of Electrical and Electronics Engineers (IEEE) 754, data compatible the Portable Operating System Interface (POSIX), alphanumeric values, the American Standard Code for Information Exchange (ASCII) text, and digits that are readable by humans. The data received from the communication busses 26 describe the operating parameters of the vehicle 10.

Figure 2:
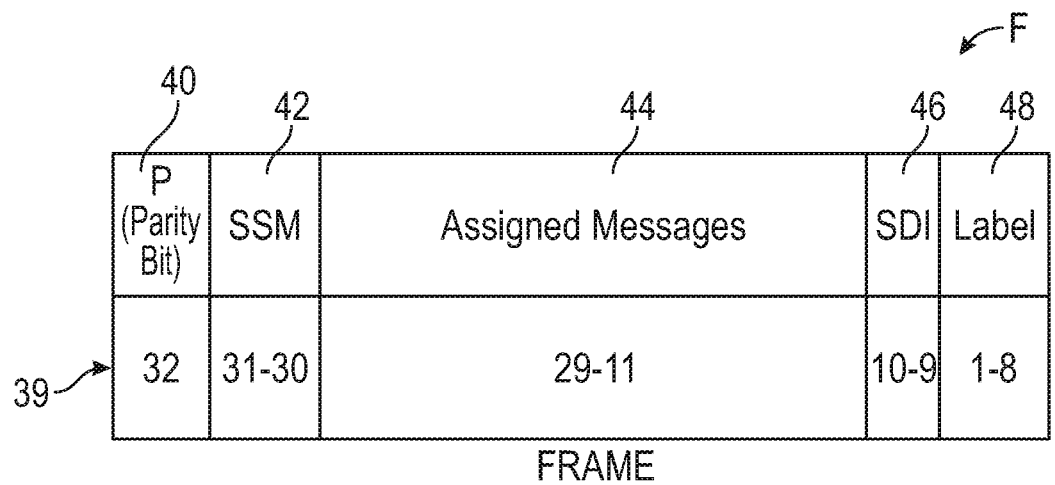
FIG. 2 illustrates the structure of an exemplary frame that is sent to the on-board recorder shown in FIG. 1, according to an exemplary embodiment.

The data received from the communication buses 26 is in the form of data sequences. A data sequence includes plurality of frames F (shown in FIG. 2). Each frame F of the data sequence is received and recorded by the on-board recorder 20 at periodic intervals. The frames F each include a plurality of bits 39 that are arranged into a specific bit layout sequence or structure. The exemplary frame F in FIG. 2 contains 32 bits, however, it is to be appreciated that the frames are not limited to any specific numbers of bits. In the non-limiting embodiment as shown in FIG. 2, the frame F is based on the Aeronautical Radio, Incorporated (ARINC) 429 data transfer protocol. The data transfer protocol defines the structure of the frame F. The data transfer protocol is based on the specific application. For example, the ARINC 429 data transfer protocol is used for an aircraft. Another example of an aircraft data protocol is the Avionics Full-Duplex Switched Ethernet (AFDX). Alternatively, in another example, if the vehicle 10 is an automobile then the data transfer protocol may be based on the Controller Area Network (CAN) protocol.

The exemplary frame F of FIG. 2 includes a specific format or frame layout. The specific data transfer protocol and an interface control document that is used dictates the frame layout. An interface control document for a data communication interface describes the data items and messages passed though, protocols observed and timing and sequencing of events. In the example as shown, the bit layout is determined based on the ARINC 429 data transfer protocol. The frame F includes a most significant bit (bit 32) that is a parity bit 40. Bits 31 and 30 of the frame F represent a sign status matrix (SSM) 42. Bits 29-11 represent an assigned parameter content, which is referred to as an assigned message 44. Bits 10-9 represent a source destination identifier (SDI) 46 (i.e., the on-board recorder 20). The SDI 46 may also be used to identify the system or subsystem transmitting the data. Bits 8-1 represent a label 48. The assigned message 44 contains data representing one or more operating parameters, and the label 48 contains a message identifier (msg ID) that describes the operating parameters contained in the assigned message 44. For example, if the assigned message 44 contains data representing an air temperature, then the label 48 includes a message identifier of air temp. In one embodiment, the assigned message 44 contains a plurality operating parameters. For example, both the engine total air temperature and the total air temperature of an aircraft may be included within the content of an assigned message 44. Accordingly, the label 48 contains message identifiers for both the engine total air temperature and the total air temperature.

The frame layout defines various parameters of the frame F such as, but not limited to, time offset, bit length, what each bit combination represents, and a set of expected message identifiers. The time offset indicates the time that the on-board recorder 20 receives and records a specific message identifier (i.e., an operating parameter). For example, if the message identifier for air temperature includes a time offset of 0.05 seconds, then the time offset for the message identifier air temp is 0.05 seconds. Accordingly, the on-board recorder 20 receives and records the frame F containing the assigned message 44 for air temperature every 0.05 seconds. The on-board recorder 20 is configured to record data at any rate and is not limited to a 1 to 1 relationship. Furthermore, it is to be appreciated that various operating parameters are sent over the communication busses 26 to the on-board recorder 20 at different times. For example, if the message identifier for vehicle speed is 0.1 seconds, then the on-board recorder 20 receives and records the frame F containing the assigned message 44 for the air temperature every 0.05 seconds and the frame containing the assigned message 44 for vehicle speed every 0.1 seconds.

The bit length indicates the total number of bits that are expected to be in each frame. For example, the frame F in FIG. 2 includes a bit length of 32 bits. The set of expected message identifiers include a plurality of message identifiers that are valid for a particular data sequence, and any message identifier that is not part of the set of expected message identifiers is determined to be invalid. For example, if the expected set of message identifiers include message identifiers MsgID_001, Msg_002, Msg_003, and Msg_004 and the on-board recorder 20 receives message identifier Msg_008, then the message identifier Msg_008 is determined to be invalid.

Referring to both FIGS. 1 and 2, the on-board recorder 20 receives data sequences from the communication busses 26. A data sequence includes a plurality of frames F that are each recorded by the on-board recorder 20 at a periodic interval. In other words, the plurality of frames F are each received and recorded by the on-board recorder 20 at a specific sampling rate or frequency. The specific frequency depends upon the particular application as well as the type of data that is represented by the plurality of frames F. For example, some applications such as aviation or space exploration require a higher frequency or sampling rate when compared to other types of applications, such as automotive applications. Furthermore, some types of operating parameters that are essential to operation of the vehicle 10 require a higher sampling rate when compared to other non-essential operating parameters. For example, measured airspeed, which is an essential operating parameter for an aircraft, is transmitted from the sensor to the on-board recorder 20 at a frequency ranging from about 100 milliseconds to about 200 milliseconds. In contrast, non-essential or ancillary parameters like month, day, and year may be sampled at significantly lower rates, such as one per minute or per hour.

Sometimes a fault occurs either with the on-board recorder 20 or a system upstream, such as the communication busses 26 or the vehicle systems 30. As a result of the fault, poor quality data is recorded and stored by the on-board recorder 20. Some examples of poor quality data include, but are not limited to, missing assigned messages 44, assigned messages 44 having the same timestamp that include different data, invalid message identifiers, or frames F having an incorrect bit length. As explained below, the on-board recording system 18 executes instructions to determine an error that is created in response to a fault. It is to be appreciated that in some embodiments the on-board recorder 20 determines the faults, and in other embodiments the processing computers 38 determine the fault. In the embodiments as described, the on-board recording system 18 determines an error with periodic data. Although the on-board recording system 18 is described as detecting errors based on recording periodic data, it is to be appreciated that the on-board recording system 18 may also monitor, record, and store aperiodic data as well. In contrast to periodic data, aperiodic data is recorded in response to an event of interest occurring.

In one embodiment, the on-board recording system 18 detects an error in response to determining the presence of one or more missing messages that create a time gap in a data sequence. Referring to both FIGS. 1 and 2, the on-board recording system 18 receives as input a data sequence including a plurality of frames F that are each received and recorded by the on-board recorder 20 at corresponding assigned time offsets and include a corresponding assigned message (44). Each frame F includes an assigned message 44. As mentioned above, the assigned message 44 is indicative of one or more operating parameters of the vehicle 10. For example, in an embodiment the assigned message 44 only represents a single operating parameter such as air temperature, but in another embodiment the assigned message 44 includes several operating parameters. The on-board recording system 18 then determines a missing assigned message 44 that has not been received at the corresponding assigned time offset. The missing assigned message 44 is determined based on more than one approach. For example, referring specifically to FIG. 2, the label 48 contains a message identifier that describes the operating parameter air temperature. However, the on-board recording system 18 determines there is no data contained in the assigned message 44. This missing data in the assigned message 44 creates a time gap in the data that is being recorded and stored by the on-board recorder 20. Alternatively, in another example, the on-board recorder 20 does not receive any frame F at the expected frequency, which also creates the time gap in the data that is being recorded as well.

In response to determining the missing assigned message 44, the on-board recording system 18 calculates a total length of time when one or more assigned messages 44 are missing in the data sequence. The on-board recording system 18 calculates the total length of time based on a number of missing assigned messages 44 that are stored in the memory 140. In other words, the on-board recording system 18 calculates the total length of time where time gaps exist in the data stored in the memory 140 of the on-board recording system 18, where the time gaps are created by missing data in the assigned message 44 portion of the frame F (FIG. 2).

The on-board recording system 18 then compares the total length of time with a threshold length of time to determine an error. The threshold length of time is explained in greater detail below and represents a limit of missing assigned messages 44 in a data sequence stored in the memory 140 of the on-board recorder 20 or, alternatively, of the processing computers 38 (seen in FIG. 3). When the total length of time within the data sequence exceeds the threshold length of time, then a fault has occurred within the on-board recorder 20, the data busses 26, the vehicle systems 30, or another component located upstream of the on-board recorder 20. In some instances, the on-board recording system 18 determines the length of time is greater than the threshold length of time. In response to determining the total length of time is greater than the threshold length of time, the on-board recording system 18 determines an error has occurred. However, in other instances, on-board recording system 18 determines the total length of time is less than or equal to the threshold length of time, and therefore no error is detected.

The value for the threshold length of time varies based on several factors. Specifically, the value of the threshold length of time depends upon the specification application, an operational phase of the vehicle 10, and the specific operating parameters of the missing assigned message 44. The specific application refers to the specific type of vehicle 10 that is operating (i.e., an aircraft, a spacecraft, etc.). It is to be appreciated that some types of applications require greater precision or accuracy when compared to other types of applications. For example, space vehicles tolerate less error and require greater precision in operation when compared to some other types of applications, such as automobiles. Accordingly, the threshold length of time for a space vehicle is generally less than the threshold length of time for an automobile. The operational phase of the vehicle 10 refers to the specific operating condition of the vehicle 10. For example, if the vehicle 10 is an aircraft, then the operating conditions are referred to as the phases of flight. The phases of flight include taxi, takeoff, cruise, descent, final approach, and landing. In another example, an automobile may include operating conditions such as, but not limited to, start-up, stop-and-go or city driving, and steady-state or highway driving. Finally, it is to be appreciated that some operating parameters are more significant or essential to monitor when compared to other operating parameters. For example, the vertical acceleration parameter in an aircraft is significant and therefore requires close monitoring.

It is to be appreciated that in some embodiments, the threshold length of time varies based on both the operational phase as well as the operating parameters of the assigned message 44. For example, if the vehicle 10 is an aircraft and the operating parameter is the wheel weight, the threshold length of time changes based on the phase of flight. Specifically, when the aircraft is in the takeoff or landing phase of flight, then the wheel weight is to be monitored much more closely than the other phases of flight such as cruise. Accordingly, the threshold length of time is significantly less in takeoff and landing when compared to the other phases of flight. However, other operating parameters may include a static threshold length of time that does not change based on the operational phase of the vehicle 10. For example, if the vehicle 10 is an aircraft and the operating parameter is vertical acceleration, then the threshold length of time does not vary based on the phase of flight. This is because the vertical acceleration is as essential operating parameter that requires close monitoring during all phases of flight.

As mentioned above, sometimes the on-board recording system 18 determines that total length of time within the data sequence is less than the threshold length of time and therefore no error has occurred. In response to determining the length of time is less than or equal to than the threshold length of time, the on-board recording system 18 determines a percentage of missing assigned messages 44 with respect to the entire run time of the data sequence, which is saved in the memory 140 of the on-board recorder 20 or the processing computers 140 (seen in FIG. 3). The on-board recording system 18 then compares the percentage of missing assigned messages 44 with a threshold percentage value. The threshold percentage value is described in greater detail below. In some instances, the on-board recording system 18 determines that the percentage of missing assigned messages 44 is greater than the threshold percentage value. In response to determining that the percentage of missing assigned messages 44 is greater than the threshold percentage value, the on-board recording system 18 determines an error. However, in response to determining that the percentage of missing assigned messages 44 is equal to or less than the threshold percentage value, then no error has occurred.

The threshold percentage value is determined based on the specific application and the specific operating parameters of the missing assigned messages 44. Similar to the threshold length of time, the threshold percentage value is less for some types of applications, such as space vehicles, that require less error than other applications such as automobiles. Moreover, some operating parameters are more significant or essential to monitor when compared to other operating parameters, and therefore the threshold percentage value is less or smaller for essential operating parameters when compared to less essential operating parameters.

In another embodiment, the on-board recording system 18 detects an error in response to determining the assigned messages 44 of two different frames F include the same timestamp but do not include identical content in the assigned message 44. It is to be appreciated that in some embodiments, the timestamp of a single frame F is not actually embedded in the bit structure. Instead, the on-board recording system 18 determines the timestamp, which is then added to the corresponding one of the plurality of frames F. However, in other embodiments the timestamp may be provided within each of the plurality of frames F. Thus, depending on the time of creation, a timestamp may represent the time the data was generated, or the time at which the data was actually assigned to a value. In one embodiment the on-board recorder 20 receives a first frame F having a first assigned message 44 with a first timestamp. The first frame F is part of the data sequence. Then, the on-board recorder 20 receives a second frame F having a second assigned message 44 with a second timestamp. It is to be appreciated that the second frame F is received by the on-board recorder 20 at some time after the first frame F. The on-board recording system 18 compares the first timestamp to the second timestamp. In some instances, the on-board recording system 18 determines the first timestamp is identical to the second timestamp. In response to determining the first timestamp is identical to the second timestamp, the on-board recording system 18 compares the data content of the two assigned messages 44 (i.e., the on-board recording system 18 compares a first data content of the first assigned message 44 with a second data content of the second assigned message 44). In some instances, the on-board recording system 18 determines the first data content is not identical to the second data content. In response to determining the first data content is not identical to the second data content, then the on-board recording system 18 determines an error has occurred.

In an alternative embodiment, the on-board recording system 18 does not determine a fault has occurred in response to determining that the first data content of the first assigned message 44 is not identical to the second data content of the second assigned message 44. Instead, the on-board recording system 18 determines an error based on a number of times the same timestamp occurs within the same data sequence with assigned messages 44 that include different data. Specifically, the on-board recording system 18 determines an error in response to determining that the number of assigned messages 44 in a specific data sequence that include an identical timestamp and different data represented the assigned message 44 exceed a threshold number of repeated timestamps. It is to be appreciated that the specific data sequence represents a single operational cycle (e.g., a single flight), since it is possible for two different sets of data collected at two different operational cycles to include the same timestamp, but have different data represented by the assigned messages 44.

In one embodiment, the on-board recorder 20 receives one or more frames F that each include a corresponding assigned message 44 after receiving the second frame F. The on-board recording system 18 then determines that one or more corresponding assigned messages 44 include a timestamp that is identical to the first timestamp and an assigned message 44 that is different from the first assigned message 44. In response to determining one or more corresponding assigned messages 44 include timestamps that are identical to the first timestamp and assigned messages 44 that are different from the first assigned message 44, the on-board recording system 18 determines a number of assigned messages 44 of the data sequence stored in the memory 140 of the on-board recorder 20 or the processing computers 38 (FIG. 3) that include timestamps identical to the first timestamp and assigned messages 44 that are different from the first assigned message 44. The on-board recording system 18 then compares the number of assigned messages 44 that are stored in the memory 140 of the on-board recorder 20 or the processing computers 38 (FIG. 3) to the threshold number of repeated timestamps. In some instances, the on-board recording system 18 determines the number of assigned messages 44 is greater than the threshold number of repeated timestamps. In response to determining the number of assigned messages 44 is greater than the threshold number of frames, the on-board recording system 18 determines the error has occurred.

The threshold number of repeated timestamps is determined based on the specific application and the operating parameters that the assigned messages 44 represent. Specifically, applications or operating parameters that require greater precision or accuracy tolerate fewer assigned messages 44 with an identical timestamp, while applications or operating parameters requiring less precision or accuracy tolerate more assigned messages 44 with an identical timestamp.

Furthermore, it is to be appreciated that in some embodiments the number of assigned messages 44 having a repeated timestamp with the same data content increase over the operational life of the on-board recorder 20. Accordingly, in some embodiments, the on-board recording system 18 saves the total number of assigned messages 44 with identical timestamps and data content from previous operating cycles in the memory 140, which is referred to as a total number of timestamp errors. The operating cycle represents a flight if the vehicle 10 is an aircraft or, alternatively, a driving cycle if the vehicle 10 is an automobile. In one embodiment, the on-board recording system 18 compares the total number of timestamp errors between subsequent operating cycles to determine if errors are increasing over time. In other words, the on-board recording system 18 determines an aggregate number of errors collected from each operational cycle, and then compares the aggregate number of errors from the operational cycles to determine if the number of errors based on identical timestamps tend to increase over time.

In still another embodiment, the on-board recording system 18 determines an error in response to determining the bit length of one or more frame F of the data sequence is incorrect. The bit length, time offset, bit length, what each bit combination represents, and the set of expected message identifiers for the plurality of frames F of a data sequence are determined based on the specific data transfer protocol and the interface control document. In one embodiment, the on-board recording system 18 detects a single frame F having an incorrect bit length, where the single frame F is part of the data sequence including a plurality of frames F. In response to detecting the single frame F with the incorrect bit length, the on-board recording system 18 determines an error.

Alternatively, in another embodiment, the on-board recording system 18 does not determine an error in response to detecting only a single frame F with the incorrect bit length. Instead, after detecting the single frame F with the incorrect bit length, the on-board recording system 18 continues to monitor the data sequence. At some point in time, sometimes the on-board recording system 18 detects one or more frames F that are part of the data sequence and are stored in the memory 140 of the on-board recorder 20 or the processing computers 38 (FIG. 3) that each have the incorrect bit length. In some embodiments, the on-board recording system 18 determines the frames F having the incorrect bit length exceed a threshold number of frames having incorrect bits. In response to determining the frames F that each have the incorrect bits exceed the threshold number of frames having incorrect bits, the on-board recording system 18 determines an error.

The threshold number of frames having incorrect bits is determined based on the specific application and the operating parameters that the assigned messages 44 represent. Specifically, applications or operating parameters that require greater precision or accuracy require fewer frames F having the incorrect number of bits, while applications or operating parameters requiring less precision or accuracy tolerate more frames F having the incorrect number of bits.

In yet another embodiment, the on-board recording system 18 determines an error based on an invalid message identifier. As mentioned above and as shown in FIG. 2, the label 48 contains one or more message identifiers, where the message identifiers describe one or more operating parameters that are contained in the assigned message 44 of a particular frame F. The plurality of frames F received by the on-board recorder 20 each include one or more message identifiers associated with the corresponding assigned message 44. Each data sequence that is received by the on-board recorder 20 includes an expected set of message identifiers that indicate the message identifiers that are valid for a data sequence. The on-board recording system 18 compares the one or more message identifier of each of the plurality of frames F with the expected set of message identifiers. In some instances, the on-board recording system determines at least one message identifier of one of the plurality of frames F is not included in the expected set of message identifiers. In response to determining at least one message identifier is not included in the expected set of message identifiers, the on-board recording system 18 determines the error has occurred.

The message identifier and the assigned message 44 are only sent to the on-board recorder 20 at the time offset. If the on-board recorder 20 receives a frame F containing a specific message identifier and the associated assigned message 44 at a point in time that is different from the time offset, then the on-board recording system 18 determines an error. Alternatively, in another embodiment, if no frame F is received at all at the time offset, then the on-board recording system 18 detects an error. The plurality of frames F received by the on-board recording system 18 each include one or more message identifiers associated with the corresponding assigned message 44. Each unique message identifier is also assigned to a unique time offset. For example, a unique message identifier assigned to an assigned message 44 indicating air temperature is assigned a unique time offset of 0.05 seconds. Another unique message identifier assigned to another assigned message 44 indicating vehicle speed is assigned a unique time offset of 0.1 seconds.

The on-board recording system 18 compares the timestamp for each unique message identifier for each of the plurality of frames F with the assigned unique time offset. In some instances, the on-board recording system 18 determines the timestamp of the unique message identifier indicates the corresponding assigned message 44 was sent at a time that is different from the unique time offset. For example, the on-board recording system 18 may determine that the assigned message 44 for the air temperature was sent at 0.06 seconds instead of the unique time offset of 0.05 seconds. In response to determining the corresponding assigned message 44 was sent at a time that is different from the unique time offset, the on-board recording system 18 determines an error has occurred.

Referring to FIG. 1, in response to determining an error, the on-board recording system 18 generates an alarm or other indicator for notifying personnel of a fault. Some examples of alarms include, but are not limited to, an email message, a Short Message Service (SMS) message, or a telephone call. In another embodiment, the alarm or indicator is a separate data file including a log of all errors and their corresponding memory locations are generated. It is to be appreciated that the alarm or indicator may include other forms as well. In an embodiment, the data recorded by the on-board recorder 20 is saved in a historical database. The data stored in the historical database may be used to detect trends in data collection, to create reports, or to perform quality checks.

Referring generally to the figures, technical effects and benefits of the present disclosure include an on-board recording system for a vehicle that detects errors during the recording process. The on-board recording system also generates an alarm or other indicator for notifying personnel of the error immediately. In contrast, conventional data systems may not detect errors at all, and may even use these errors while performing data analysis.

Figure 3:
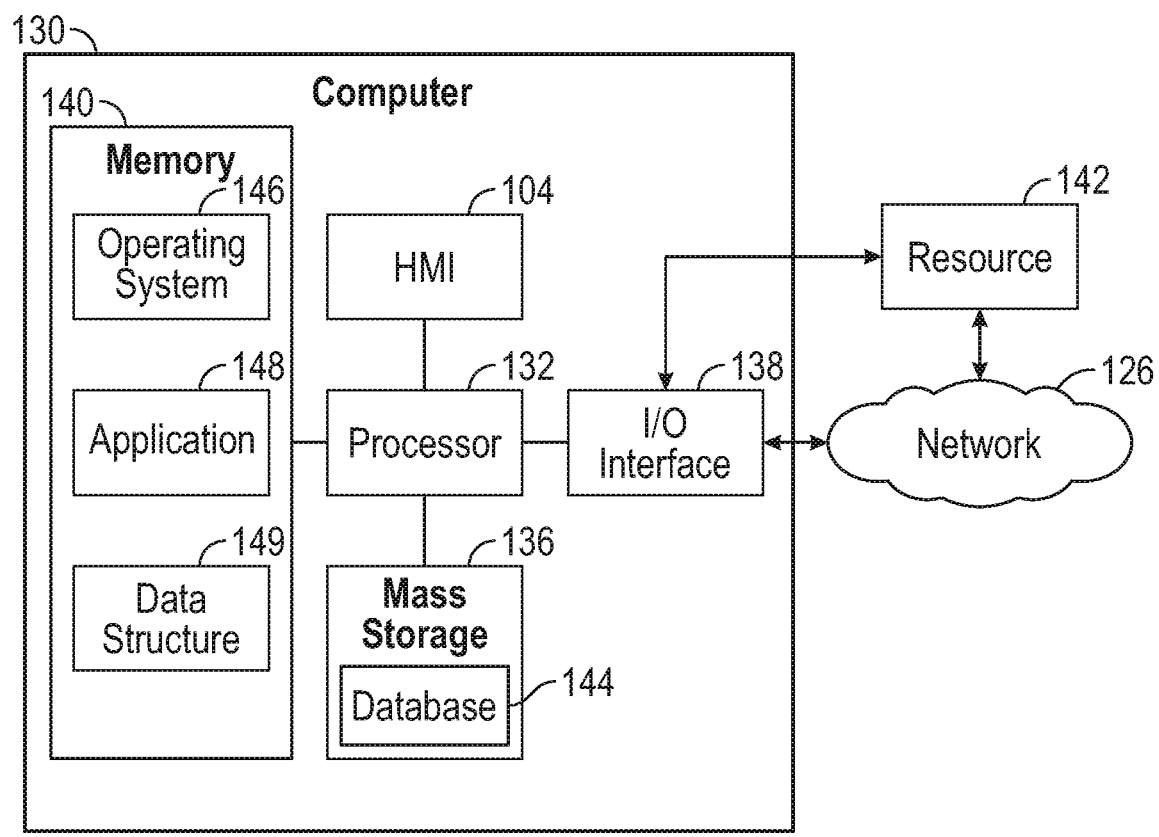
FIG. 3 is an illustration of a computer system used by the on-board recorder and the processing computers shown in FIG. 1, according to an exemplary embodiment.

Referring now to FIG. 3, the on-board recorder 20 and the processing computers 38 are implemented on one or more computer devices or systems, such as exemplary computer system 130. The computer system 130 includes a processor 132, the memory 140 (seen in FIG. 1), a mass storage memory device 136, an input/output (I/O) interface 138, and a Human Machine Interface (HMI) 104. The computer system 130 is operatively coupled to one or more external resources 142 via the network 126 or I/O interface 138. External resources may include, but are not limited to, servers, databases, mass storage devices, peripheral devices, cloud-based network services, or any other suitable computer resource that may be used by the computer system 130.

The processor 132 includes one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 140. Memory 140 includes a single memory device or a plurality of memory devices including, but not limited to, read-only memory (ROM), random access memory (RAM), volatile memory, non-volatile memory, static random-access memory (SRAM), dynamic random-access memory (DRAM), flash memory, cache memory, or any other device capable of storing information. The mass storage memory device 136 includes data storage devices such as a hard drive, optical drive, tape drive, volatile or non-volatile solid-state device, or any other device capable of storing information.

The processor 132 operates under the control of an operating system 146 that resides in memory 140. The operating system 146 manages computer resources so that computer program code embodied as one or more computer software applications, such as an application 148 residing in memory 140, may have instructions executed by the processor 132. In an alternative embodiment, the processor 132 may execute the application 148 directly, in which case the operating system 146 may be omitted. One or more data structures 149 also reside in memory 140, and may be used by the processor 132, operating system 146, or application 148 to store or manipulate data.

The I/O interface 138 provides a machine interface that operatively couples the processor 132 to other devices and systems, such as the network 126 or external resource 142. The application 148 thereby works cooperatively with the network 126 or external resource 142 by communicating via the I/O interface 138 to provide the various features, functions, applications, processes, or modules comprising embodiments of the invention. The application 148 also includes program code that is executed by one or more external resources 142, or otherwise rely on functions or signals provided by other system or network components external to the computer system 130. Indeed, given the nearly endless hardware and software configurations possible, persons having ordinary skill in the art will understand that embodiments of the invention may include applications that are located externally to the computer system 130, distributed among multiple computers or other external resources 142, or provided by computing resources (hardware and software) that are provided as a service over the network 126, such as a cloud computing service.

The HMI 104 is operatively coupled to the processor 132 of computer system 130 in a known manner to allow a user to interact directly with the computer system 130. The HMI 104 may include video or alphanumeric displays, a touch screen, a speaker, and any other suitable audio and visual indicators capable of providing data to the user. The HMI 104 also includes input devices and controls such as an alphanumeric keyboard, a pointing device, keypads, pushbuttons, control knobs, microphones, etc., capable of accepting commands or input from the user and transmitting the entered input to the processor 132.

A database 144 may reside on the mass storage memory device 136 and may be used to collect and organize data used by the various systems and modules described herein.

The database 144 may include data and supporting data structures that store and organize the data. In particular, the database 144 may be arranged with any database organization or structure including, but not limited to, a relational database, a hierarchical database, a network database, or combinations thereof. A database management system in the form of a computer software application executing as instructions on the processor 132 may be used to access the information or data stored in records of the database 144 in response to a query, where a query may be dynamically determined and executed by the operating system 146, other applications 148, or one or more modules.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. An on-board recording system for a vehicle, wherein the on-board recording system is configured to monitor data for errors, the on-board recording system comprising:
   one or more processors; and
   a memory coupled to the one or more processors, the memory storing data comprising a database and program code that, when executed by the one or more processors, causes the on-board recording system to:
      receive as input a data sequence including a plurality of frames that are each received and recorded by the on-board recording system at a corresponding assigned time offset and include a corresponding assigned message;
      determine a missing assigned message that has not been received at the corresponding assigned time offset;
      in response to determining the missing assigned message, calculate a total length of time based on a number of missing assigned messages that are stored in the memory;
      compare the total length of time with a threshold length of time;
      determine the total length of time is greater than the threshold length of time;
      in response to determining the total length of time is greater than the threshold length of time, determine an error has occurred;
      receive a first frame having a first assigned message with a first timestamp, wherein the first frame is part of the data sequence;
      receive a second frame having a second assigned message with a second timestamp, wherein the second frame is received after the first frame;
      compare the first timestamp of the first assigned message to the second timestamp of the second assigned message; and
      determine the first timestamp is identical to the second timestamp.

2. The on-board recording system of claim 1, wherein the one or more processors execute instructions to:
   determine the total length of time is less than or equal to the threshold length of time; and
   in response to determining the total length of time is less than or equal to than the threshold length of time, determine a percentage of missing assigned messages with respect to an entire run time of the data sequence saved in the memory of the on-board recording system.

3. The on-board recording system of claim 2, wherein the one or more processors execute instructions to:
   compare the percentage of missing assigned messages with a threshold percentage value;
   determine that the percentage of missing assigned messages is greater than the threshold percentage value; and
   in response to determining that the percentage of missing assigned messages is greater than the threshold percentage value, determine the error has occurred.

4. The on-board recording system of claim 1, wherein the one or more processors execute instructions to:
   in response to determining the first timestamp is identical to the second timestamp, compare a first data content of the first assigned message with a second data content of the second assigned message;
   determine the first data content is not identical to the second data content; and
   in response to determining the first data content is not identical to the second data content, determine the error has occurred.

5. The on-board recording system of claim 1, wherein the one or more processors execute instructions to:
   receive one or more frames that each include the corresponding assigned message after receiving the second frame;
   determine that one or more corresponding assigned messages include timestamps identical to the first timestamp and assigned messages that are different from the first assigned message;
   in response to determining the one or more corresponding assigned messages include the timestamps that are identical to the first timestamp and assigned messages that are different from the first assigned message, determine a number of assigned messages of the data sequence stored in the memory of the on-board recording system that include the timestamps that are identical to the first timestamp and assigned messages that are different from the first assigned message;
   compare the number of assigned messages to a threshold number of repeated timestamps;
   determine the number of assigned messages is greater than the threshold number of repeated timestamps; and
   in response to determining the number of assigned messages is greater than the threshold number of repeated timestamps, determine the error has occurred.

6. The on-board recording system of claim 1, wherein the one or more processors execute instructions to:
   in response to determining the error, generating an alarm.

7. The on-board recording system of claim 1, wherein the plurality of frames each include one or more message identifiers associated with the corresponding assigned message, and wherein the one or more processors execute instructions to:
   compare the one or more message identifier of each of the plurality of frames with an expected set of message identifiers;
   determine at least one message identifier of one of the plurality of frames is not included in the expected set of message identifiers; and
   in response to determining at least one message identifier is not included in the expected set of message identifiers, determine the error has occurred.

8. An on-board recording system for a vehicle, wherein the on-board recording system is configured to monitor data for errors, the on-board recording system comprising:
   one or more processors; and
   a memory coupled to the one or more processors, the memory storing data comprising a database and program code that, when executed by the one or more processors, causes the on-board recording system to:

receive as input a data sequence including a plurality of frames that are each received and recorded by the on-board recording system at a corresponding assigned time offset and include a corresponding assigned message, wherein the plurality of frames each include one or more message identifiers associated with the corresponding assigned message, and wherein a unique message identifier is assigned to a unique time offset;

determine a missing assigned message that has not been received at the corresponding assigned time offset;

in response to determining the missing assigned message, calculate a total length of time based on a number of missing assigned messages that are stored in the memory;

compare the total length of time with a threshold length of time;

determine the total length of time is greater than the threshold length of time;

in response to determining the total length of time is greater than the threshold length of time, determine an error has occurred;

compare a timestamp for the unique message identifier for each of the plurality of frames with the unique time offset that has been assigned;

determine the timestamp of the unique message identifier indicates the corresponding assigned message was sent at a time that is different from the unique time offset; and in response to determining the corresponding assigned message was sent at a time that is different from the unique time offset, determine the error has occurred.

9. The on-board recording system of claim 1, wherein the vehicle is an aircraft, an automobile, an unmanned aerial vehicle (UAV), a spacecraft, or a marine vessel.

10. A method for detecting errors in an on-board recording system in a vehicle, the method comprising:

receiving, by a computer of the on-board recording system, a data sequence including a plurality of frames that are received and recorded by the on-board recording system at a corresponding assigned time offset and include a corresponding assigned message;

determining, by the computer, a missing assigned message that has not been received at the corresponding assigned time offset;

in response to determining the missing assigned message, calculate a total length of time based on a number of missing assigned messages stored in a memory;

comparing the total length of time with a threshold length of time;

determining the total length of time is greater than the threshold length of time;

in response to determining the total length of time is greater than the threshold length of time, determining an error has occurred;

receiving a first frame having a first assigned message with a first timestamp, wherein the first frame is part of the data sequence;

receiving a second frame having a second assigned message with a second timestamp, wherein the second frame is received after the first frame;

comparing the first timestamp of the first assigned message to the second timestamp of the second assigned message; and determining the first timestamp is identical to the second timestamp.

11. The method of claim 10, further comprising:

determining the total length of time is less than or equal to the threshold length of time; and in response to determining the total length of time is less than or equal to than the threshold length of time, determining a percentage of missing assigned messages with respect to an entire run time of the data sequence saved in the memory of the on-board recording system.

12. The method of claim 11, the method further comprising:

comparing the percentage of missing assigned messages with a threshold percentage value;

determining the percentage of missing assigned messages is greater than the threshold percentage value; and in response to determining that the percentage of missing assigned messages is greater than the threshold percentage value, determining the error has occurred.

13. The method of claim 10, further comprising:

in response to determining the first timestamp is identical to the second timestamp, comparing a first data content of the first assigned message with a second data content of the second assigned message;

determining the first data content is not identical to the second data content; and in response to determining the first data content is not identical to the second data content, determining the error has occurred.

14. The on-board recording system of claim 8, wherein the one or more processors execute instructions to:

in response to determining the error, generating an alarm.

15. The on-board recording system of claim 14, wherein the alarm is one or more of the following: an email message, a Short Message Service (SMS) message, a telephone call, and a data file.

16. The on-board recording system of claim 8, wherein the vehicle is an aircraft, an automobile, an unmanned aerial vehicle (UAV), a spacecraft, or a marine vessel.

17. The method of claim 10, further comprising:

receiving one or more frames that each include the corresponding assigned message after receiving the second frame;

determining that one or more corresponding assigned messages include timestamps identical to the first timestamp and assigned messages that are different from the first assigned message;

in response to determining the one or more corresponding assigned messages include the timestamps that are identical to the first timestamp and assigned messages that are different from the first assigned message, determining a number of assigned messages of the data sequence stored in the memory of the on-board recording system that include the timestamps that are identical to the first timestamp and assigned messages that are different from the first assigned message;

comparing the number of assigned messages to a threshold number of repeated timestamps; and determine the number of assigned messages is greater than the threshold number of repeated timestamps.

18. The method of claim 17, further comprising:

in response to determining the number of assigned messages is greater than the threshold number of repeated timestamps, determining the error has occurred.

19. The method of claim 10, further comprising:

in response to determining the error, generating an alarm.

20. The method of claim 10, wherein the vehicle is an aircraft, an automobile, an unmanned aerial vehicle (UAV), a spacecraft, or a marine vessel.

* * * * *